United States Patent [19]

Elms

[11] 4,365,302

[45] Dec. 21, 1982

[54] HIGH ACCURACY AC ELECTRIC ENERGY METERING SYSTEM

[75] Inventor: Robert T. Elms, Monroeville, Pa.

[73] Assignee: Westinghouse Electric Corp., Pittsburgh, Pa.

[21] Appl. No.: 224,871

[22] Filed: Jan. 14, 1981

[51] Int. Cl.³ ............................................ G01R 21/06
[52] U.S. Cl. ................................. 364/483; 324/76 R
[58] Field of Search ............... 364/483, 492, 200, 900; 324/76 R, 78 D, 83 D, 103 R, 99 D, 115, 142

[56] References Cited

U.S. PATENT DOCUMENTS

| | | | |
|---|---|---|---|
| 4,077,061 | 2/1978 | Johnston et al. | 364/483 |
| 4,217,651 | 8/1980 | Pickering | 364/483 X |
| 4,261,037 | 4/1981 | Hicks | 364/483 |
| 4,291,376 | 9/1981 | McCahill | 364/483 |
| 4,291,377 | 9/1981 | Schneider et al. | 364/483 |
| 4,301,508 | 11/1981 | Anderson et al. | 364/483 |
| 4,335,445 | 6/1982 | Nercessian | 364/483 X |

OTHER PUBLICATIONS

Dugutak Wattneter Using a Sampling Method, R. S. Turgel, IEEE Transactions on Instrumentation and Measurement, Dec. 1974, pp. 337–341.

Primary Examiner—Edward J. Wise
Attorney, Agent, or Firm—Robert E. Converse, Jr.

[57] ABSTRACT

An input module and a sample and hold circuit cooperate to produce sample values representative of the instantaneous magnitudes of three-phase line voltages and line currents delivered to a load by a power distribution system. The sample values representative of the line voltages are input directly to a multiplexer. The sample values representative of the line currents are input to the multiplexer both directly and through ranging amplifiers. When the sample values of the line currents are below a predetermined magnitude, the sample values amplified by the ranging amplifiers are used, thus increasing the accuracy of the metering system. The sample values are input to an analog-to-digital converter where the sample values are digitized. A control circuit calculates a plurality of indica of the AC electric energy quantity delivered to the load from the digitized data. An output module is responsive to the control circuit for displaying, recording or transmitting the calculated indica. A timing circuit times out a predetermined sample timer interval. At the end of the interval the control circuit produces new sample values and resets the timing circuit. The timing circuit is constructed so as to recognize a plurality of failure modes of the control circuit and reset the control circuit in response thereto thus improving the reliability of the metering system.

21 Claims, 5 Drawing Figures

FIG.4

HIGH ACCURACY AC ELECTRIC ENERGY METERING SYSTEM

BACKGROUND OF THE INVENTION

1. Field of the Invention

The present invention is related to electrical energy measuring devices for electric utility systems, and more particularly to solid state devices utilizing digital processing techniques.

2. Description of the Prior Art

The electromechanical rotating disc type of watthour meter continues to enjoy almost exclusive use in electrical metering applications. However, because of the desire to effectuate other services such as remote meter reading, time of day metering, and load control substantial time has been invested in developing cost effective alternatives to the standard watthour meter. One such line of products from this development is the solid state microprocessor based electric energy metering system.

With the advent of low cost solid state circuits such as microprocessors, programmable read only memories (PROM's), random access memories (RAM's), etc., solid state electric energy metering systems are becoming increasingly more common. Nevertheless, substantial problems have to be overcome before solid state circuits can be applied to electric energy metering systems. One problem is due to the fact that solid state circuits operate utilizing low voltage input signals whereas the input signals available at the point of measurement for metering systems are line voltage and line current. Substantial problems are encountered in producing the requisite low level input signals from line voltage and line current. Another problem is that line current varies from approximately ½ to 200 amperes. Still another problem is that devices such as microprocessors operate digitally. This means that line voltage and current, or signals representative thereof, must be digitized with the attendant problems of sampling rates and sample resolution. Also, a microprocessor needs a list of instructions, or a program, in order to properly run the solid state metering system. Very often transients, noise, or unexpected disturbances will disrupt the microprocessor causing the metering system to malfunction. These and other problems have been solved to some degree by currently available solid state electric energy metering systems.

An example of one such metering system is disclosed in U.S. Pat. No. 4,077,061. Disclosed therein is a digital processing and calculating AC electric energy measuring system which includes a sequence controller and a calculator subsystem for controlling the metering system operations in accordance with a predetermined program. An analog input circuit receives voltage and current signal components of an electric energy quantity to be measured by the metering system. A sample timer circuit utilizes the sequence controller and calculator subsystem clock for producing sample interval timer pulses which initiate each randomized sampling interval. Instantaneous sample values of the voltage and current signals are thus obtained at randomized sampling times in response to the sample timer interval pulses. The instantaneous signal values are sequentially digitized by an analog-to-digital converter. From this raw data a plurality of parameters of the electric energy quantity to be measured are calculated in a common calculation program subroutine operating on the digitized instantaneous signal values. Totalizing each of these calculated values produces the value of the time integral of the measured electric energy parameter. An output readout or display produces numerical readings representative of the plurality of electric energy parameters calculated by the metering system. A plurality of output pulse data signals representing the calculated parameters are input to a pulse receiver device capable of transmitting the data pulses through a remote metering telemetry system or for being recorded in a recorder type of receiver device.

While the system described above, as well as several other types of electric energy metering systems, has overcome the basic problems of applying solid state technology to metering applications, there nevertheless remains substantial room for improvement, particularly in the areas of accuracy and reliability. The present invention is for an AC electric energy metering system having substantial improvements in the accuracy and reliability of the system.

SUMMARY OF THE INVENTION

The present invention is for a high accuracy AC electric energy metering system capable of calculating a plurality of indicia of an AC electric energy quantity delivered to a load. Such indicia include real power measured in kilowatts, reactive power measured in var's and volts squared as well as the time integral of these quantities. The present invention utilizes an input module which produces six analog input signals representative of the voltages and currents in a three phase power distribution system. The six analog input signals are input to a sample and hold circuit which produces sample values representative of the instantaneous magnitude of each of the six input signals. The sample values representative of the instantaneous magnitude of the three phase voltages are input directly to a multiplexer. The sample values representative of the instantaneous magnitude of the three phase currents are input both directly to the multiplexer and to the multiplexer through ranging amplifiers. The ranging amplifiers are used to amplify the sample values of the three phase currents. This amplification results in significant improvement in the accuracy of the electric energy metering system and is considered to be an important feature of the present invention.

The sample values of the three phase voltages and currents are sequentially input to an analog-to-digital converter. The digitized sample values are input to a control circuit wherein the desired quantities are calculated. The results of the calculation are input to an output module which produces appropriate visual readings. The output module may additionally act as an interface for a recording device or a remote meter reading system.

A timing circuit is used to time out sampling intervals. At that end of each sampling interval the control circuit instructs the sample and hold circuit to produce new sample values. The control circuit then resets the timing circuit. A timing window is produced within the timing circuit which determines the appropriate times during which the control circuit should reset the timing circuit. If the control circuit attempts to reset the timing circuit outside of the timing window, it is presumed that the control circuit is lost and the timing circuit resets the control circuit. Additional failure modes of the control circuit are detected by a failure of the control circuit to reset the timing circuit or if the control circuit produces a reset signal of inappropriate duration. In either case the timing circuit will initiate a reset of the control circuit. The timing circuit of the present invention greatly improves the reliability of the electric energy metering system disclosed herein and is considered to be an important feature of the present invention.

DESCRIPTION OF THE PREFERRED EMBODIMENT

Figure 1:
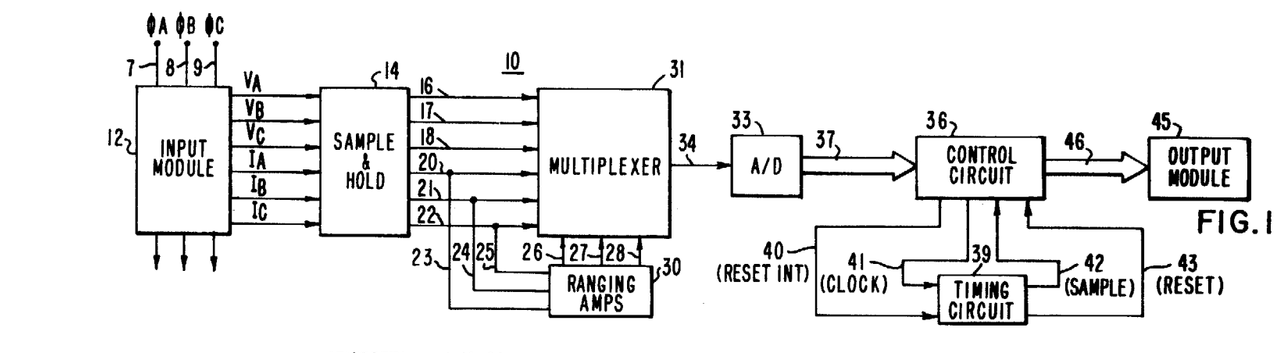
FIG. 1 is a block diagram illustrating an AC electric energy metering system constructed according to the teachings of the present invention.

Referring to FIG. 1 a sollid state AC electric energy metering system 10 constructed according to the teachings of the present invention is shown. The metering system 10 shown in FIG. 1 is similar in design and operation to the metering system shown in U.S. Pat. No. 4,077,061 which issued Feb. 28, 1970 to Johnston et al., and which is assigned to the same assignee as the present invention. The aforementioned U.S. Patent is hereby incorporated by reference and may be referred to for non-essential information such as circuit details and part numbers for elements not considered to be important features of the present invention as well as a detailed description of the operation of the metering system 10.

In FIG. 1 an input module 12 produces voltage component signals $V_A$, $V_B$ and $V_C$ and current component signals $I_A$, $I_B$ and $I_C$ representative of a three phase AC electric energy quantity delivered to a load (not shown) by a power distribution system consisting of conductors 7, 8 and 9. The voltage component signals $V_A$, $V_B$ and $V_C$ are produced by conventional potential transformers (not shown) and are representative of the three phase voltages A, B and C, respectively. Similarly, the current component signals $I_A$, $I_B$ and $I_C$ are produced by conventional current transformers (not shown) and are representative of the three phase currents A, B and C, respectively.

The voltage component signals and the current component signals are input to a sample and hold circuit 14. The sample and hold circuit 14 produces sample values representative of the instantaneous magnitudes of the voltage and current component signals. The sample values representative of the instantaneous magnitudes of the voltage component signals $V_A$, $V_B$ and $V_C$ are input to a multiplexer 31 through conductors 16, 17 and 18, respectively. The sample values representative of the instantaneous magnitudes of the current components $I_A$, $I_B$ and $I_C$ are input to the multiplexer 31 through conductors 20, 21 and 22, respectively. The sample values representative of the instantaneous magnitudes of the current components $I_A$, $I_B$ and $I_C$ are also input to ranging amplifiers 30 through conductors 23, 24 and 25. The ranging amplifiers 30 amplify the sample values representative of the instantaneous magnitudes of the current component signals. The amplified sample values of the current component signals $I_A$, $I_B$ and $I_C$ are input to the multiplexer 31 through conductors 26, 27 and 28, respectively. The ranging amplifiers 30 are considered to be an important feature of the present invention and are discussed in detail in conjunction with FIG. 4.

The multiplexer 31 sequentially inputs each of the sample values to an analog-to-digital converter 33 through a conductor 34. The analog-to-digital converter 33 digitizes each of the sample values. The digitized sample values are then input to a control circuit 36 through parallel conductors 37. The control circuit 36 thus has available digitized sample values representative of the instantaneous magnitudes of the three phase voltages and currents delivered to the load. From this raw data the control circuit calculates a plurality of indicia of the AC electric energy quantity delivered to the load. Such indicia include real power measured in kilowatts, reactive power measured in voltage amperes reactive, volts squared, and the time integral of these quantities. While the control circuit 36 is substantially complicated it is not considered to be an important feature of the present invention. The reader wishing more details of the construction and operation of the control circuit 36 is referred to the above-mentioned U.S. Patent.

The control circuit 36 produces a reset interval signal which is input to a timing circuit 39 through a conductor 40. The control circuit 36 also produces a clock signal Cl composed of a plurality of pulses which is input to the timing circuit 39 through a conductor 41. The timing circuit 39 produces a sample signal and a reset signal which are input to the control circuit 36 through conductors 42 and 43, respectively. The timing circuit 39 produces the sample signal in response to an accumulation of the pulses of the clock signal Cl. The sample signal indicates the end of a predetermined time interval. At the end of each time interval the control circuit 36 produces new sample values and resets the timing circuit 39 with the reset interval signal carried by the conductor 40. The timing circuit 39 also recognizes a plurality of failure modes of the control circuit 36 and resets the control circuit 36 with the reset signal carried by conductor 43 in response to the recognition of these failure modes. The timing circuit 39 is considered to be an important feature of the present invention and is discussed in detail in conjunction with FIGS. 2 and 3.

Concluding the description of FIG. 1 an output module 45 receives signals representative of the calculated indicia of the AC energy quantity from the control circuit 36 through parallel conductors 46. The output module 45 drives a plurality of output devices (not shown) such as displays or relays. The output module 45 also acts as an interface between the metering system 10 and external devices such as recorders or remote meter reading systems.

Figure 2:
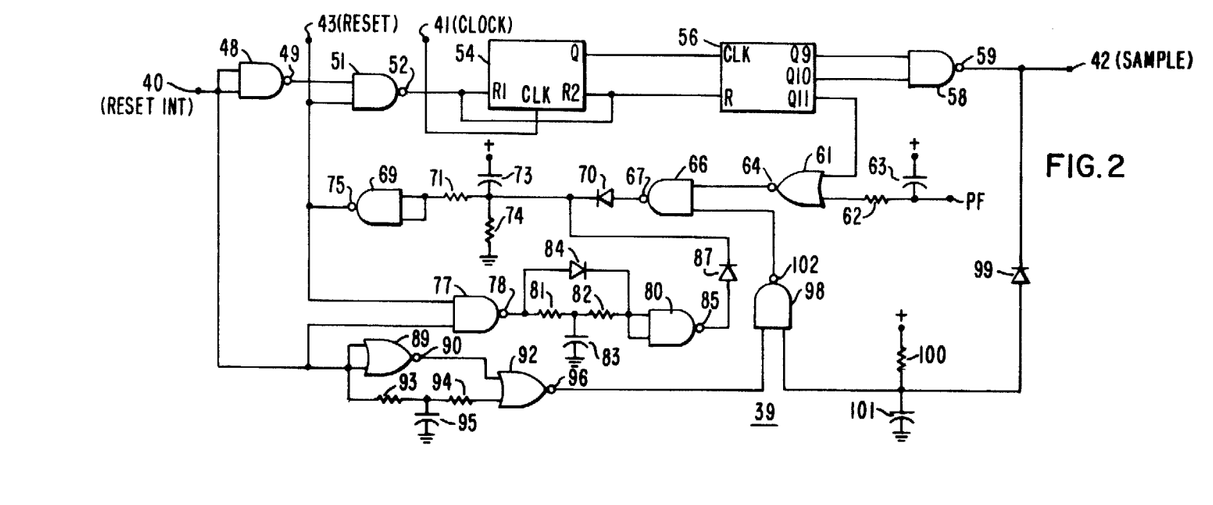
FIG. 2 is an electrical schematic illustrating the details of the timing circuit shown in FIG. 1.

FIG. 2 is an electrical schematic illustrating the details of the timing circuit 39. As mentioned above the timing circuit 39 performs a plurality of functions. During normal operation the timing circuit 39 counts the pulses of the clock signal Cl carried by conductor 41. When a predetermined number has been reached the timing circuit 39 changes the state of the sample signal carried by the conductor 42. After the sample signal has changed state the timing circuit is reset by the control circuit 36 by the reset interval signal carried by the conductor 40. When the timing circuit is reset the sample signal returns to its initial state. In this manner the timing circuit 39 times out a predetermined time period.

A second function of the timing circuit 39 is to reset the control circuit 36 with the reset signal carried by the conductor 43 when the control circuit 36 begins executing commands out of sequence, executing commands at inappropriate times or otherwise becomes lost. The timing circuit 39 is constructed so as to recognize a plurality of failure modes of the control circuit 36 which indicate that the control circuit is lost. These failure modes include, (1) the failure of the control circuit 36 to reset the timing circuit 39, (2) a reset interval signal of inappropriate duration during an appropriate time for a timing circuit reset, and (3) a reset interval signal of any duration during an inappropriate time for a timing circuit reset. When any of these events occur the presumption is that the control circuit 36 is lost and must be reset. The timing circuit 39 additionally detects when a power supply for the metering system 10 goes out of regulation. The timing circuit 39 holds the control circuit 36 in a reset condition until the supply voltage is returned to acceptable values. The description of the hardware shown in FIG. 2 which follows hereinafter will be related to the functions discussed above. A detailed description of the operation of the circuit shown in FIG. 2 is found hereinbelow in conjunction with FIG. 3.

Turning to FIG. 2, a NAND gate 48 receives the reset interval signal from the conductor 40 at a pair of input terminals. An output terminal 49 of the NAND gate 48 is connected to an input terminal of a NAND gate 51. A second input terminal of the NAND gate 51 receives the reset signal from the conductor 43. An output terminal 52 of the NAND gate 51 is connected to a first reset terminal R1 of a counter 54. The first reset terminal R1 is connected to a second reset terminal R2 of the counter 54. A clock input terminal Clk receives the clock signal Cl through the conductor 41. The second reset terminal R2 is connected to a reset terminal R of a counter 56. An output terminal Q of the counter 54 is connected to a clock input terminal Clk of the counter 56. A pair of output terminals Q9 and Q10 of the counter 56 are input to a NAND gate 58. An output terminal 59 of the NAND gate 58 is connected to the conductor 42. The counters 54 and 56 together with the NAND gate 58 cooperate to produce the sample signal in response to the pulses of the clock signal Cl carried by the conductor 41. The NAND gates 48 and 51 cooperate to effect a normal reset of the counters 54 and 56.

An output terminal Q11 of the counter 56 is connected to an input terminal of a NOR gate 61. A second input terminal of the NOR gate 61 is connected to a positive voltage source through the series combination of a resistor 62 and a capacitor 63. A power failure signal PF is input to the NOR gate 61 through the resistor 62. The power failure signal PF indicates whether the input voltage to the metering system 10 is within acceptable limits. An output terminal 64 of the NOR gate 61 is connected to an input terminal of a NAND gate 66. An output terminal 67 of the NAND gate 66 is connected to a pair of input terminals of a NAND gate 69 through the series combination of a diode 70 and a resistor 71. The junction of the diode 70 and the resistor 71 is connected to a positive voltage source through a capacitor 73 and is connected to ground through a resistor 74. An output terminal 75 of the NAND gate 69 is connected to the conductor 43. The reset signal is available at the output terminal 75. The output terminal Q11 of the counter 56 produces a signal which propagates through the gates 61, 66 and 69 to effect a reset of the control circuit 36 whenever the control circuit 36 fails to reset the timing circuit 39. The power failure signal PF propagates through the gates 61, 66 and 69 and holds the control circuit 36 in the reset condition so long as the voltage input to the metering system 10 is not within acceptable limits.

A NAND gate 77 receives the reset interval signal at a first input terminal from the conductor 40 and receives the reset signal at a second input terminal from the conductor 43. An output terminal 78 of the NAND gate 77 is connected to a pair of input terminals of a NAND gate 80 through the series combination of a resistor 81 and a resistor 82. The junction of the resistors 81 and 82 is connected to ground through a capacitor 83. The output terminal 78 of the NAND gate 77 is additionally connected to the pair of input terminals of the NAND gate 80 through a diode 84. An output terminal 85 of the NAND gate 80 is connected to the junction of the diode 70 and the resistor 71 through a diode 87. The gates 77 and 80 produce a signal which propagates through the gate 69 to effect a reset of the control circuit 36 whenever the control circuit 36 produces a reset interval signal of inappropriate duration during an appropriate time for a timing circuit reset.

The reset interval signal is input to a pair of input terminals of a NOR gate 89 An output terminal 90 of the NOR gate 89 is input to a NOR gate 92. The reset interval signal is input to the NOR gate 92 through the series combination of a resistor 93 and a resistor 94. The junction of the resistors 93 and 94 is connected to ground through a capacitor 95. An output terminal 96 of the NOR gate 92 is connected to a NAND gate 98. A second input terminal of the NAND gate 98 is connected to a positive voltage source through a resistor 100, to ground through a capacitor 101 and receives the sample signal through a diode 99. An output terminal 102 of the NAND gate 98 is connected to an input terminal of the NAND gate 66. The sample signal together with the gate 98 determines the appropriate times during which the control circuit 36 should reset the timing circuit 39. The gates 89 and 92 cooperate to produce a signal which propagates through the gates 98, 66 and 69 to effect a reset of the control circuit 36 whenever the control circuit 36 resets the timing circuit 39 during an inappropriate time.

Figure 3A:
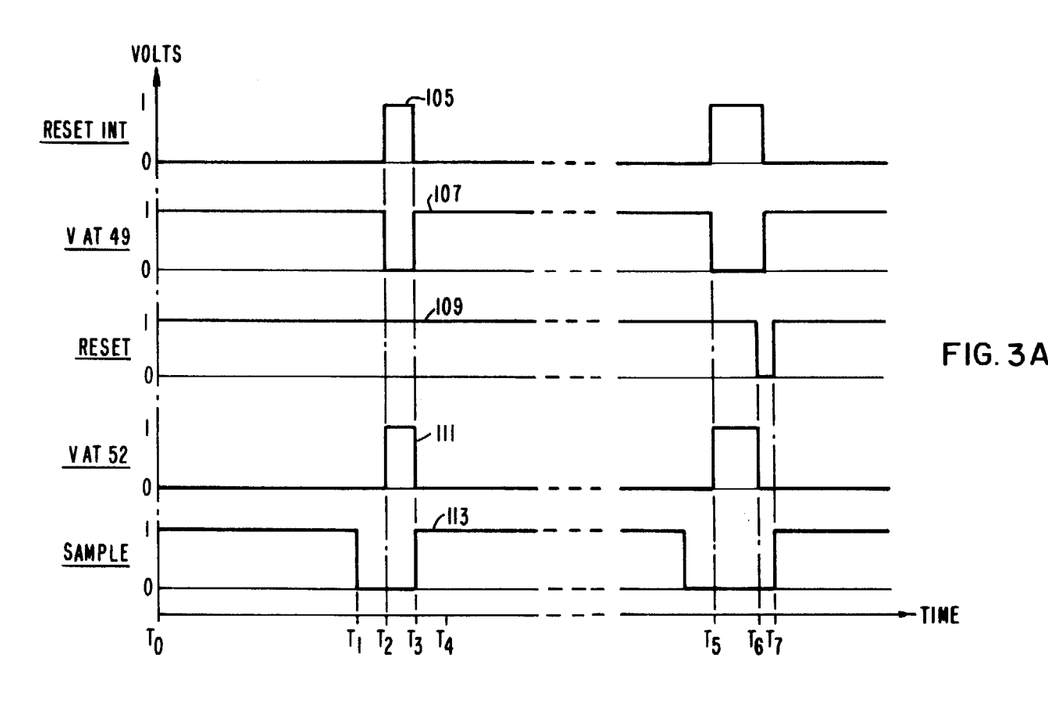
FIG. 3 is a timing diagram illustrating the logic states of the signals of the timing circuit of FIG. 2 under steady-state conditions, normal reset conditions, and reset conditions due to the recognition of a failure mode of the control circuit.
Figure 3B:
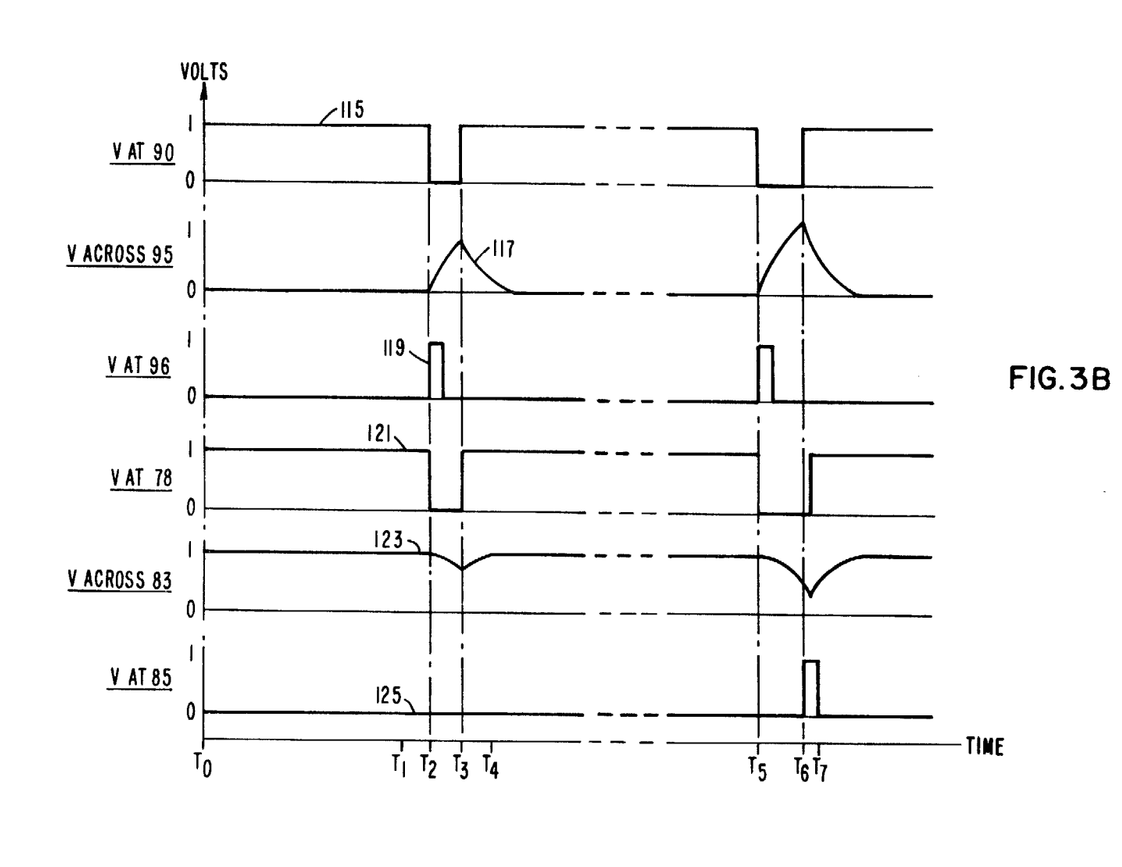

Details of the operation of the timing circuit 39 shown in FIG. 2 are discussed in conjunction with the timing diagrams shown in FIGS. 3A and 3B. The operation of the NAND and NOR logic gates is summarized in Tables 1 and 2.

TABLE 1

| NAND GATE LOGIC STATES | | |
|---|---|---|
| Input #1 | Input #2 | Output |
| 0 | 0 | 1 |
| 0 | 1 | 1 |
| 1 | 0 | 1 |
| 1 | 1 | 0 |

TABLE 2

| NOR GATE LOGIC STATES | | |
|---|---|---|
| Input #1 | Input #2 | Output |
| 0 | 0 | 1 |
| 0 | 1 | 0 |
| 1 | 0 | 0 |
| 1 | 1 | 0 |

Tables 1 and 2 summarize the logic states of the output signals for each possible combination of logic states for the input signals.

Turning to FIGS. 3A and 3B a graph of the logic states of the timing signals as a function of time is shown. The logic states of the timing signals produced by the timing circuit 39 vary from a low state, or logic 0, to a high state, or logic 1. From time $T_0$ to $T_1$ the normal or steady-state condition of the timing signals is shown. Curve 105 represents the reset interval signal which is input to the gate 48. The gate 48 acts as an inverter. The signal available at the output terminal 49 is represented by curve 107 and is the inverse of curve 105. The reset signal is represented by curve 109 and is input to the gate 51. The reset signal 109 is normally high and effects a reset of the control circuit 36 by changing to a low state. The signal available at the output terminal 52 of the gate 51 is represented by curve 111 and is a combination of curves 107 and 109.

Continuing the description of the steady-state condition of the timing circuit 39, the signal available at the output terminal 59 of the gate 58 is the sample signal and is represented by curve 113. The gate 58 is responsive to the Q9 and Q10 output terminals of the counter 56. The Q9 output terminal is representative of $2^9$ or five hundred and twelve while the Q10 output terminal is representative of $2^{10}$ or one thousand and twenty four. The signals available at these output terminals will either both be low or will be of opposite states until the counter 56 reaches a count of one thousand five hundred and thirty six. Until this time the sample signal will be in a normally high state as shown by curve 113. When the counter 56 reaches a count of one thousand five hundred and thirty six the signals available at the Q9 and Q10 output terminals are both high and the sample signal changes from a high to a low state as shown at time $T_1$ in FIG. 3A. The rate of counting and the output terminals of the counter 56 which are chosen determine the length of the predetermined time interval. With the sample signal in the low state the control circuit produces new sample values and effects a normal reset of the timing circuit, as discussed below, before the counter 56 reaches a count of two thousand and forty eight. When this count is reached the signals available at the output terminals Q9 and Q10 both go low and the signal available at the output terminal Q11 changes from a normally low to a high state.

The signal available at the Q11 output terminal only goes high when the counters 54 and 56 are not reset and the counter 56 overflows because of continuous counting. The signal available at the Q11 output terminal is input to the logic gate 61. The logic gate 61 additionally receives the power failure signal PF which is normally in a low state. The output signal available at the output terminal 64 of the logic gate 61 is normally in a high state. This signal is input to the NAND gate 66.

The signal available at the output terminal 90 of the gate 89 is normally in a high state as shown by curve 115 in FIG. 3B since the gate 89 acts as an inverter. The voltage across the capacitor 95 is represented by curve 117. The voltage across the capacitor 95 is normally in a low state responsive to the reset interval signal which is normally in a low state. The signal available at the output terminal 96 of the gate 92 is represented by curve 119 and is a combination of curves 115 and 117. The signal available at the output terminal 96 is normally in a low state. The gate 98 receives the signal represented by curve 119 and the sample signal represented by curve 113. The signal available at the output terminal 102 of the gate 98 is normally in a high state in response to these input signals. The signal available at the output terminal 67 of the gate 66 is normally in a low state since both inputs thereto are normally in a high state. The reset signal is available at the output terminal 75 of the gate 69 and is in a high state, as discussed earlier in conjunction with curve 109, in response to the low state of the signal available at the output terminal 67 of the gate 66.

The signal available at the output terminal 78 of the gate 77 is in a normally high state as represented by curve 121 in response to the reset interval signal represented by curve 105 and the reset signal represented by curve 109. The voltage across the capacitor 83 is in a normally high state as represented by curve 123 in response to the high state of the signal available at the output terminal 78. Curve 125 represents the signal available at the output terminal 85 of the gate 80. The signal available at the output terminal 85 is normally in a low state since the gate 80 acts as an inverter. This concludes the description of the steady-state condition shown in FIGS. 3A and 3B from time $T_0$ to time $T_1$.

The normal reset of the timing circuit 39 begins with the sample signal represented by curve 113 changing from a high to a low state at time $T_1$. While the sample signal is in the low state, the reset interval signal is momentarily in the high state as shown in FIG. 3A from time $T_2$ to time $T_3$. The signal available at the output terminal 49 is the inverse of the reset voltage as shown by curve 107. The combination of the signal available at the output terminal 49 and the reset signal causes the signal available at the output terminal 52 to be momentarily in a high state as shown by curve 111 in FIG. 3A from time $T_2$ to $T_3$. When the signal at the output terminal 52 of the gate 51 is high, the counters 54 and 56 are reset. With the reset of the counters 54 and 56 the sample signal returns to a high state as shown by curve 113 at time $T_3$. In summary, the counters 54 and 56 are normally reset when the reset interval signal changes from a low to a high state.

During a normal reset of the timing circuit 39 the sample signal represented by curve 113 is in a low state. With a low signal input to the gate 98 the signal available at the output terminal 102 will be in a high state regardless of the state of the other input signal to the gate 98. Thus, during a normal reset the gates 89 and 92 have no effect on the timing circuit 39. However, for purposes of analysis the signals produced by these gates will be discussed. At time $T_2$ in FIG. 3B the signal available at the output terminal 90 changes from a high to a low state as shown by curve 115. Simultaneously, the capacitor 95 begins to charge in response to the reset interval signal being in a high state. The gate 92 will produce a pulse, or spike, depending upon the value of the capacitor 95 in response to the combination of the voltage across the capacitor 95 and the signal available at the output terminal 90. This pulse, shown by curve 119, is prevented from propagating through the gates 98, 66 and 69 since the signal available at the output terminal 102 is held in a high state by the sample signal. In this manner the gates 89 and 92 have no effect on the timing circuit 39 during a normal reset.

Similarly, gates 77 and 80 have no effect on the timing circuit 39 during a normal reset. As shown by curve 121 in FIG. 3B, the signal available at the output terminal 78 changes from a high to a low state at time $T_2$. With the signal available at the output terminal 78 in the low state the capacitor 83 begins to discharge as shown by curve 123. The discharge rate of the capacitor 123 is such that the gate 80 continues to receive a high signal even though the signal available at the output terminal 78 has changed to a low state. The voltage available at the output terminal 78 returns to a high state at time $T_3$ before the capacitor 83 can discharge. Thus the signal available at the output terminal 85 of gate 80 remains unchanged throughout the normal reset of the timing circuit 39.

One failure mode which the timing circuit 39 detects is a failure of the control circuit 36 to reset the timing circuit 39. When the control circuit 36 fails to reset the timing circuit 39, it is desirable to reset both the timing circuit 39 and the control circuit 36. This result is effectuated by the signal available at the Q11 output terminal of the counter 56 changing from a normally low to a high state. This change occurs because of the continuous counting of the counter 56 as discussed above. With the signal at the Q11 output terminal in a high state the signal available at the output terminal 64 of the gate 61 changes from a high to a low state. With the low signal available at the output terminal 64 of the gate 61 input to the NAND gate 66 the signal available at the output terminal 67 changes from a normally low to a high state regardless of the other input to the NAND gate 66. The high state of the signal available at the output terminal 67 is inverted by the gate 69 causing the reset signal to change from a normally high to a low state. With the sample signal in a low state the control circuit 36 will be reset. Additionally, the signal available at the output terminal 52 of the gate 51 will change to a high state regardless of the state of the other input signal to the gate 51. With the signal available at the output terminal 52 in a high state the counters will be reset and the Q11 signal will return to its normally low state. This allows all of the timing signal produced by the reset circuit 39 to return to their steady-state conditions. In summary, both the control circuit 36 and the timing circuit 39 are reset by the signal available at the Q11 output terminal of the counter 56 in response to a failure of the control circuit 36 to reset the timing circuit 39.

The timing circuit 39 will also recognize when the supply voltage is out of regulation and will hold the control circuit 36 in a reset condition until the supply voltage returns within its predetermined limits. This is effectuated by the power failure signal PF changing from a normally low to a high state. This change of state will propagate through the gates 61, 66 and 69 in the same manner as the change of state of the signal available at the Q11 output terminal of the counter 56. The reset signal will be held in a low state so long as the power failure signal PF is in a high state.

Another failure mode of the control circuit 36 which the timing circuit 39 recognizes is an attempt by the control circuit 36 to reset the timing circuit 39 during an inappropriate time. As mentioned above the appropriate times for the control circuit 36 to reset the timing circuit 39 are determined by the cooperation of the sample signal and the NAND gate 98. The appropriate time for a timing circuit 39 reset is when the sample signal is in a low state, which is referred to as a timing window. An inappropriate time for a timing circuit 39 reset is when the sample signal is in a high state, which is referred to as outside the timing window. Turning to FIG. 3B, the gates 89 and 92 cooperate at time $T_2$ to create a pulse in response to the change of state of the reset interval signal from a low to a high state. The reader will recall that this pulse is prohibited from propagating through the gates during a normal reset because the sample signal is in a low state. However, when the control circuit 36 attempts to reset the timing circuit 39 outside of the timing window the sample signal is in a high state. Since the sample signal is in a high state the pulse produced at the output terminal 96 is allowed to propagate through the gates 98, 66 and 69 causing the reset signal to be in a low state for the duration of the pulse. When the reset signal is in a low state the control circuit 36 is reset. After the duration of the pulse the reset signal returns to its normally high state and the timing signals of the timing circuit 39 return to their steady-state conditions. In summary, the gates 89 and 92 reset the control circuit 36 when the control circuit 36 attempts to reset the timing circuit 39 outside of the timing window.

Another failure mode of the control circuit 36 which the timing circuit 39 recognizes is a reset pulse of inappropriate duration within the timing window. This is shown in FIGS. 3A and 3B beginning at time $T_5$. In FIG. 3A, at time $T_5$ the reset interval signal changes from a low to a high state as in the case of a normal reset. However, the reset interval signal remains in the high state for an inappropriate period of time. The sample signal represented by curve 113 is in a low state such that gate 98 and the pulse produced by the cooperation of gates 89 and 92 have no effect on the circuit just as in a normal reset. In FIG. 3B, at time $T_5$ the signal available at the output terminal 78 of the gate 77 changes from a high to a low state. Because the reset interval signal remains in a high state for an inappropriate duration the signal available at the gate 78 remains in a low state for an inappropriate duration thus allowing the capacitor 83 to discharge. The voltage across the capacitor 83 is represented by curve 123 and can be seen at time $T_6$ to have sufficiently discharged to allow the output signal available at the output terminal 85 of gate 80 to change from a normally low to a high state. This change in state causes the reset signal to change state which in turn resets the control circuit 36. With the control circuit 36 reset the reset interval signal returns to zero shortly after time $T_6$. With the reset interval signal returned to its steady-state condition the signal available at the output terminal 78 returns to a high state thus charging capacitor 83. At time $T_7$ the capacitor 83 has sufficiently charged such that the signal available at the output terminal 85 returns to a steady-state condition. With the return of the signal 85 to its steady-state condition the remainder of the timing signals of the timing circuit 39 return to their steady-state conditions. The value of the capacitor 83 may be chosen so as to limit the duration of acceptable reset interval pulses. In summary, the gates 77 and 80 cooperate to produce a pulse which resets the control circuit 36 whenever the control circuit 36 produces a reset interval pulse of inappropriate duration within the timing window. This concludes the discussion of the timing circuit 39.

Figure 4:
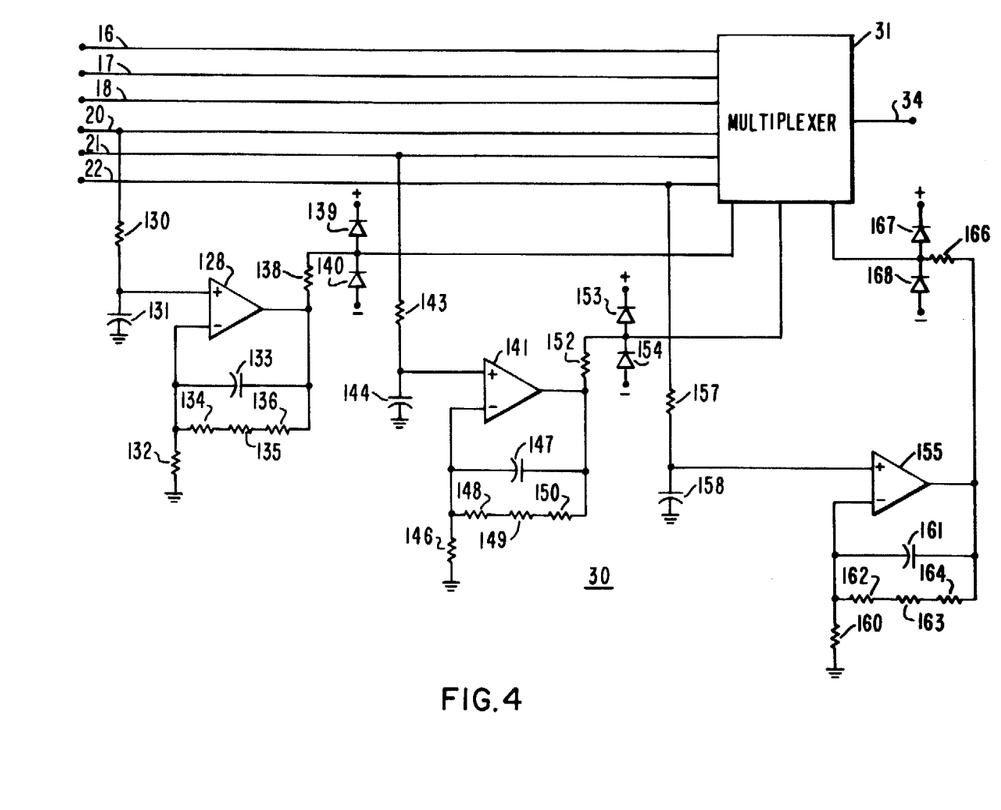
FIG. 4 is an electrical schematic illustrating the details of the ranging amplifiers shown in FIG. 1.

Turning to FIG. 4 an electrical schematic illustrating the details of the ranging amplifiers 30 is shown. The conductors 16, 17 and 18 input the sample values representative of the instantaneous magnitudes of the voltage component signals $V_A$, $V_B$ and $V_C$, respectively, to the multiplexer 31. The conductor 20 carries the sample values representative of the instantaneous magnitude of the current component signal $I_A$ which are input both to the multiplexer 31 and to a non-inverting input terminal of an operational amplifier 128 through a resistor 130. The non-inverting input terminal is connected to ground through a capacitor 131. An inverting input terminal of the operational amplifier 128 is connected to ground through a resistor 132. The inverting input terminal of the operational amplifier 128 is connected to an output terminal thereof through a capacitor 133 parallel connected with the series combination of resistors 134, 135 and 136. The output terminal of the operational amplifier 128 is connected to an input terminal of the multiplexer 31 through a resistor 138. The input terminal is connected to a positive voltage source through a diode 139 and to a negative voltage source through a diode 140.

The conductor 21 carries the sample values representative of the instantaneous magnitude of the current component signal $I_B$ which are input both to the multiplexer 31 and to a non-inverting input terminal of an operational amplifier 141 through a resistor 143. The non-inverting input terminal is connected to ground through a capacitor 144. An inverting input terminal of the operational amplifier 141 is connected to ground through a resistor 146. The inverting input terminal of the operational amplifier 141 is connected to an output terminal thereof through a capacitor 147 parallel connected with the series combination of resistors 148, 149 and 150. The output terminal of the operational amplifier 141 is connected to an input terminal of the multiplexer 31 through a resistor 152. The input terminal is connected to a positive voltage source through a diode 153 and to a negative voltage source through a diode 154.

Finally, the conductor 22 carries the sample values representative of the instantaneous magnitude of the current component signal $I_C$ which are input to both the multiplexer 31 and to a non-inverting input terminal of an operational amplifier 155 through a resistor 157. The non-inverting input terminal is connected to ground through a capacitor 158. An inverting input terminal of the operational amplifier 155 is connected to ground through a resistor 160. The inverting input terminal of the operational amplifier 155 is connected to an output terminal thereof through a capacitor 161 parallel connected with the series combination of resistors 162, 163 and 164. The output terminal of the operational amplifier 155 is connected to an input terminal of the multiplexer 31 through a resistor 166. The input terminal is connected to a positive voltage source through a diode 167 and a negative voltage source through a diode 168.

The operational amplifiers 128, 141 and 155 together with the associated components form three precision amplifiers. When the magnitude of the sample values of the current components falls below a predetermined level, the amplified sample values are digitized and input to the control circuit 36. Each of the precision amplifiers has a gain which is a power of two. This allows the control circuit 36 to easily compensate for the amplification of the sample signals representative of the instantaneous magnitudes of the current components $I_A$, $I_B$ and $I_C$ during the calculation of the plurality of electrical energy quantities. The gain of the precision amplifier formed by the operational amplifier 128 is determined by the resistors 132, 134, 135 and 136. Similarly, resistors 146, 148, 149 and 150; 160, 162, 163 and 164 determine the gain of the precision amplifiers formed by operational amplifiers 141 and 155, respectively. Each of the resistors has the same value which makes fabrication easier and allows the resistance values to be matched very closely. The diode pairs 139-140, 153-154 and 167-168 together with the resistors 138, 152 and 166, respectively, provide overvoltage protection such that voltages capable of damaging the multiplexer 31 are clamped to acceptable values.

Typical values for the components shown in FIG. 4 are:

| Component | | Value/Part No. | Accuracy |
| --- | --- | --- | --- |
| Resistor | 130 | 7.5 k | 5% |
| Capacitor | 131 | 200 pf | 20% |
| Op Amp | 128 | TL 074 (T.I.) | Industrial Grade |
| Resistors | 132, 134 | 10 k | .5% (tolerance) |
| | 135, 136 | | .1% (matching) |
| Capacitor | 133 | 200 pf | 20% |
| Resistor | 138 | 1 k | 5% |
| Diodes | 139, 140 | IN 914 | — |

Corresponding components of the other two precision amplifiers have the same values as shown above. The ranging amplifiers 30 have been found to significantly increase the overall accuracy of the metering system 10. This concludes the description of FIG. 4.

What we claim is:

1. An improved AC electric energy metering system for calculating a plurality of indicia of an AC electric energy quantity delivered by an electric utility system, said metering system comprising:

signal sample means including inputs and outputs, said inputs receiving line voltages and currents determining the magnitude of the AC electric energy quantity, said outputs producing sample values representative of the instantaneous magnitudes of said line voltages and currents when said signal sample means is rendered to a sampling state;

sample timer means producing a sample signal having first and second states, said first state occurring at randomly varying intervals and rendering said signal sample means to said sampling state at randomly occurring sampling times;

analog-to-digital converter means producing binary signal representations of each of said sample values;

control means calculating the plurality of indicia of said AC electric energy quantity from said binary signal representations of each of said sample values, said control means producing a reset interval signal composed of pulses, said pulses resetting said sample timer means;

means resetting said control means when a pulse of said reset interval signal is input to said sample timer means while said sample signal is in said second state;

output means producing data output signals representative of said plurality of indicia of said AC electric energy quantity.

2. The system of claim 1 including a source of clock pulses, and wherein the sample timer means includes a counter responsive to said clock pulses.

3. The system of claim 2 wherein the means producing the sample signal includes a gate responsive to the counter, the first state of said sample signal being representative of the proper times to reset the sample timer means, the second state of said sample signal being representative of the improper times to reset said sample timer means.

4. The system of claim 3 wherein the gate includes a NAND gate.

5. The system of claim 3 wherein the means for resetting the control means produces a reset signal in response to a pulse of the reset interval signal being input to the sample timer means while said sample signal is in the second state.

6. The system of claim 5 wherein the means for resetting includes an inverter responsive to the reset inverval signal, means for delaying said reset interval signal, a first gate responsive to both the inverted reset interval signal and the delayed reset interval signal, and a second gate responsive to both the sample signal and said first gate.

7. The system of claim 6 wherein the means for delaying includes a capacitor, and wherein the first gate includes a NOR gate, and wherein the second gate includes a NAND gate.

8. The system of claim 1 including means for resetting both the sample timer means and the control means when said control means fails to reset said sample timer means.

9. The system of claim 8 wherein the sample timer means includes a counter, and wherein the means for resetting includes a gate responsive to on overflow output terminal of said counter.

10. The system of claim 9 wherein the gate includes a NOR gate.

11. The system of claim 1 including means for resetting the control means when a pulse of the reset interval signal of inappropriate duration is input to the sample timer means while the sample signal is in the first state.

12. The system of claim 11 wherein the inappropriate duration includes DC signals.

13. The system of claim 11 wherein the means for resetting includes a first gate responsive to the reset interval signal, means for delaying responsive to said first gate, and an inverter responsive to both said first gate and said means for delaying.

14. The system of claim 13 wherein the first gate includes a NAND gate, and wherein the means for delaying includes a capacitor.

15. The system of claim 1 including a power supply producing a regulated suply voltage, and including means for resetting the control means in response to said supply voltage being out of regulation.

16. The system of claim 15 wherein the control means is held in the reset condition so long as the supply voltage is out of regulation.

17. The system of claim 15 wherein the ranging amplifiers include non-inverting amplifiers having a gain that is a power of two.

18. The system of claim 1 including ranging amplifiers responsive to the sample values of the line currents.

19. The system of claim 18 including means for multiplexing, said means responsive to both the signal sample means and the ranging amplifiers.

20. The system of claim 1 including a source of clock pulses, and wherein the sample timer and the means resetting the control means include;
   a counter responsive to said clock pulses,
   a first gate producing the sample signal in response to said counter,
   means producing a first reset signal for resetting the control means in response to a pulse of the reset interval signal being input to said sample timer means,
   a second gate selectively conducting said first reset signal in response to said sample signal,
   a third gate responsive to said counter, said gate producing a second reset signal for resetting the control means when said control means fails to reset said sample timer means,
   a fourth gate responsive to said said second and said third gates,
   means producing a third reset signal for resetting the control means when a pulse of said reset interval signal input to the sample timer means while said sample signal is in the first state is of an inappropriate duration, and
   a fifth gate responsive to both said fourth gate and said third reset signal.

21. The system of claim 20 including a power supply producing a regulated supply voltage, and wherein the third gate produces the second reset signal for resetting the control means in response to said supply voltage being out of regulation.

* * * * *